United States Patent
Daimon et al.

(10) Patent No.: US 12,081,190 B2
(45) Date of Patent: Sep. 3, 2024

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Hiromu Okunaga, Nagaokakyo (JP); Takuya Koyanagi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 854 days.

(21) Appl. No.: 17/102,468

(22) Filed: Nov. 24, 2020

(65) Prior Publication Data

US 2021/0111697 A1  Apr. 15, 2021

Related U.S. Application Data

(63) Continuation of application No. PCT/JP2019/026346, filed on Jul. 2, 2019.

(30) Foreign Application Priority Data

Jul. 3, 2018 (JP) ................................. 2018-127006

(51) Int. Cl.
*H03H 9/02* (2006.01)
*H03H 9/05* (2006.01)
(Continued)

(52) U.S. Cl.
CPC .... *H03H 9/02574* (2013.01); *H03H 9/02015* (2013.01); *H03H 9/02228* (2013.01);
(Continued)

(58) Field of Classification Search
CPC ........... H03H 9/02574; H03H 9/02015; H03H 9/02228; H03H 9/058; H03H 9/25;
(Continued)

(56) References Cited

U.S. PATENT DOCUMENTS

2002/0093394 A1  7/2002  Tikka et al.
2004/0251987 A1  12/2004  Nakamura et al.
(Continued)

FOREIGN PATENT DOCUMENTS

JP          06152317 A    5/1994
JP        2002198777 A    7/2002
(Continued)

OTHER PUBLICATIONS

International Search Report in PCT/JP2019/026346, mailed Sep. 3, 2019, 4 pages.
(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a support substrate and first and second resonant sections adjacent to each other on the support substrate. Each of the first and second resonant sections includes a piezoelectric thin film, an IDT electrode on the piezoelectric thin film, and a support layer surrounding the piezoelectric thin film in a plan view of the acoustic wave device. The support layer has a different linear expansion coefficient from the piezoelectric thin film. The piezoelectric thin film in the first resonant section and the piezoelectric thin film in the second resonant section are divided by the support layer between the resonant section and the resonant section.

17 Claims, 11 Drawing Sheets

(51) Int. Cl.
*H03H 9/25* (2006.01)
*H03H 9/64* (2006.01)

(52) U.S. Cl.
CPC .............. *H03H 9/058* (2013.01); *H03H 9/25* (2013.01); *H03H 9/6483* (2013.01)

(58) Field of Classification Search
CPC .... H03H 9/6483; H03H 9/542; H03H 9/1042; H03H 3/10; H03H 9/02897; H03H 9/1092; H03H 9/02834
USPC .......................................... 333/133, 193–196
See application file for complete search history.

(56) References Cited

U.S. PATENT DOCUMENTS

| | | | |
|---|---|---|---|
| 2011/0115339 A1 | 5/2011 | Makibuchi et al. | |
| 2013/0285768 A1 | 10/2013 | Watanabe et al. | |
| 2016/0277003 A1* | 9/2016 | Kikuchi | H03H 9/14541 |
| 2017/0373663 A1 | 12/2017 | Kishimoto et al. | |
| 2018/0102757 A1 | 4/2018 | Fukushima et al. | |
| 2019/0081610 A1 | 3/2019 | Iwamoto | |
| 2019/0181829 A1 | 6/2019 | Kikuchi et al. | |
| 2019/0238114 A1 | 8/2019 | Kishimoto et al. | |
| 2020/0195219 A1* | 6/2020 | Yamamoto | H03F 3/245 |

FOREIGN PATENT DOCUMENTS

| | | |
|---|---|---|
| JP | 2004343735 A | 12/2004 |
| JP | 2008211394 A | 9/2008 |
| JP | 2010098385 A | 4/2010 |
| JP | 2012009947 A | 1/2012 |
| JP | 2013009173 A | 1/2013 |
| JP | 2013106089 A | 5/2013 |
| JP | 2015073331 A | 4/2015 |
| JP | 2017152870 A | 8/2017 |
| JP | 2018007239 A | 1/2018 |
| WO | 2009157587 A1 | 12/2009 |
| WO | 2013081026 A1 | 6/2013 |
| WO | 2015098678 A1 | 7/2015 |
| WO | 2016208426 A1 | 12/2016 |
| WO | 2018003283 A1 | 1/2018 |
| WO | 2018061436 A1 | 4/2018 |
| WO | 2018096783 A1 | 5/2018 |

OTHER PUBLICATIONS

Written Opinion in PCT/JP2019/026346, mailed Sep. 3, 2019, 6 pages.

* cited by examiner

ACOUSTIC WAVE DEVICE

CROSS REFERENCE TO RELATED APPLICATIONS

This application claims the benefit of priority to Japanese Patent Application No. 2018-127006 filed on Jul. 3, 2018 and is a Continuation Application of PCT Application No. PCT/JP2019/026346 filed on Jul. 2, 2019. The entire contents of each application are hereby incorporated herein by reference.

BACKGROUND OF THE INVENTION

1. Field of the Invention

The present disclosure relates to an acoustic wave device, and more particularly, to an acoustic wave device having improved temperature characteristics.

2. Description of the Related Art

Recently, multiband communication for performing communication using radio waves in a plurality of frequency bands has been promoted in the field of communication devices, such as a cellular phone and a smart phone. With such a tendency, a multiplexer including a plurality of filters is more generally used in those communication devices to divide the received radio waves into signals in different frequency bands.

For example, Surface Acoustic Wave (SAW) filters or Bulk Acoustic Wave (BAW) filters can be utilized as the filters for use in the multiplexer. A multiplexer having a one-chip structure in which the filters are provided on the same substrate is often adopted in a mobile terminal to reduce the device size.

Japanese Unexamined Patent Application Publication No. 2018-7239 discloses an acoustic wave device including a plurality of acoustic wave resonators that are provided in the same support substrate. In the acoustic wave device disclosed in Japanese Unexamined Patent Application Publication No. 2018-7239, the acoustic wave resonators are provided on a common piezoelectric thin film, and a support layer made of another material is disposed around the piezoelectric thin film.

In an acoustic wave device including an acoustic wave resonator provided on a piezoelectric thin film, temperatures of the acoustic wave resonator and the piezoelectric thin film increase with a current flowing through the acoustic wave resonator. In the case of providing a plurality of acoustic wave resonators as in the acoustic wave device disclosed in Japanese Unexamined Patent Application Publication No. 2018-7239, if the frequencies used in the acoustic wave resonators are different due to imbalanced use of frequency bands, a temperature distribution is generated in the common piezoelectric thin film, and the piezoelectric thin film is locally deformed. This may cause a possibility that TCF (Temperature Coefficients of Frequency) characteristics degrade.

SUMMARY OF THE INVENTION

Preferred embodiments of the present invention improve TCF characteristics in acoustic wave devices, which each include a plurality of acoustic wave resonators provided on a common support substrate.

An acoustic wave device according to a preferred embodiment of the present invention includes a support substrate, a first resonant section, and a second resonant section, the first and second resonant sections being adjacent to each other on the support substrate. Each of the first resonant section and the second resonant section includes a piezoelectric thin film, an IDT electrode disposed on the piezoelectric thin film, and a support layer surrounding the piezoelectric thin film in a plan view of the acoustic wave device. The support layer has a different linear expansion coefficient from the piezoelectric thin film. The piezoelectric thin film in the first resonant section and the piezoelectric thin film in the second resonant section are divided by the support layer between the first resonant section and the second resonant section.

With the acoustic wave devices according to preferred embodiments of the present invention, the piezoelectric thin films are divided for each resonant section and each of the piezoelectric thin films is surrounded by the support layer with a different linear expansion coefficient from the piezoelectric thin film. Therefore, even when a temperature of the piezoelectric thin film increases, a deformation of the piezoelectric thin film is able to be reduced or prevented by the support layer with the different linear expansion coefficient, and an influence on the adjacent resonant section is also able to be reduced or prevented. As a result, TCF characteristics of the acoustic wave device are able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
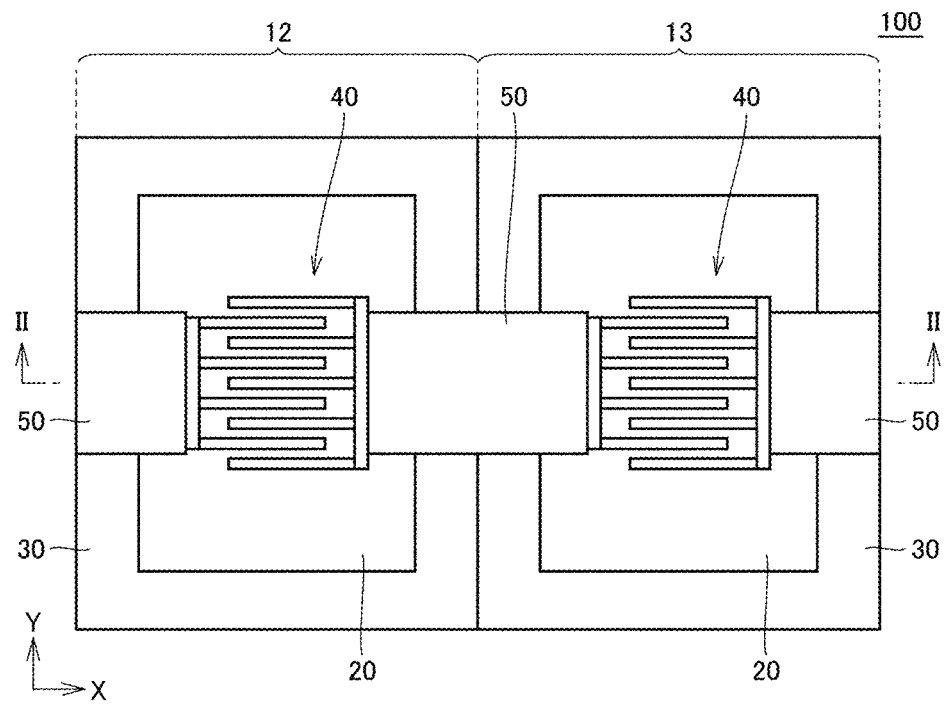
FIG. 1 is a plan view of an acoustic wave device according to Preferred Embodiment 1 of the present invention.

Preferred embodiments of the present disclosure will be described below with reference to the drawings. It is to be noted that the same components or equivalent components in the drawings are denoted by the same reference signs and description of those components is not repeated.

Preferred Embodiment 1

Figure 2:
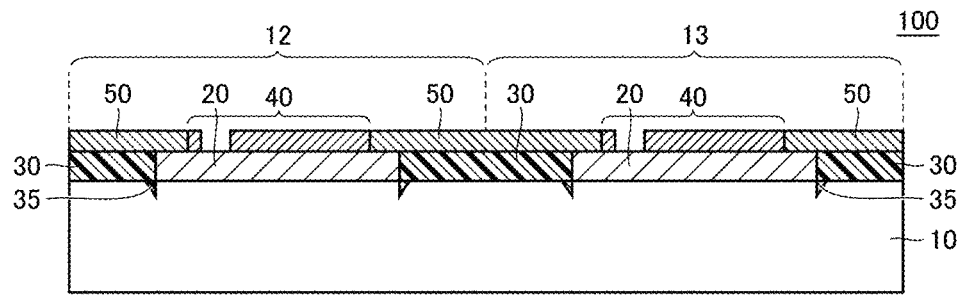
FIG. 2 is a sectional view of the acoustic wave device, illustrated in FIG. 1, taken along a plane II-II.

FIG. 1 is a plan view of an acoustic wave device 100 according to Preferred Embodiment 1 of the present invention. FIG. 2 is a sectional view of the acoustic wave device 100, illustrated in FIG. 1, taken along a plane II-II.

Referring to FIGS. 1 and 2, the acoustic wave device 100 includes a support substrate 10 and resonant sections 12 and 13 that are adjacent to each other on the support substrate 10. Although Preferred Embodiment 1 is described, by way of example, in connection with the case in which the acoustic wave device includes two resonant sections, the acoustic wave device may include three or more resonant sections. Furthermore, although the following description is made, by way of example, in connection with the case in which a SAW filter is formed in the resonant section, a BAW filter may be formed in the resonant section.

The support substrate 10 can be made of any suitable piezoelectric material, such as, for example, lithium tantalate (LiTaO$_3$), lithium niobate (LiNbO$_3$), and quartz, various ceramics such as alumina (Al$_2$O$_3$), magnesia, silicon nitride (SiN), aluminum nitride (AlN), silicon carbide (SiC), zirconia (ZrO$_2$), cordierite, mullite, steatite, and forsterite, dielectrics such as glass, semiconductors such as silicon (Si), sapphire, and gallium nitride (GaN), and a resin substrate.

Each of the resonant sections 12 and 13 includes a piezoelectric thin film 20 and an acoustic wave resonator that includes an IDT (Interdigital Transducer) electrode 40 provided on the piezoelectric thin film 20. A surface acoustic wave resonator (SAW filter) is defined by the piezoelectric thin film 20 and the IDT electrode 40.

The piezoelectric thin film 20 is made of, for example, a piezoelectric single-crystal material such as lithium tantalate, lithium niobate, zinc oxide (ZnO), aluminum nitride, or lead zirconate titanate (PZT), or a piezoelectric multilayer material containing one or more of the above-described single-crystal materials. The IDT electrode 40 can be made of a metal material, such as, for example, an elemental metal including at least one selected from among aluminum (Al), copper (Cu), silver (Ag), gold (Au), titanium (Ti), tungsten (W), platinum (Pt), chromium (Cr), nickel (Ni), and molybdenum (Mo), or an alloy including at least one of the above-described elements as a main component. The IDT electrode 40 may have a structure in which a plurality of metal films each made of one of the above-described metals or alloys are laminated.

As illustrated in the plan view of FIG. 1, the piezoelectric thin film 20 of each of the resonant sections 12 and 13 is surrounded by the support layer 30 in a plan view of the acoustic wave device 100. As illustrated in the sectional view of FIG. 2, the piezoelectric thin film 20 in the resonant section 12 and the piezoelectric thin film 20 in the resonant section 13 are divided by the support layer 30. In other words, the piezoelectric thin films 20 of the resonant sections 12 and 13 are disposed on the common support substrate 10 independently of each other.

The support layer 30 is made of a material with a lower linear expansion coefficient than the piezoelectric thin film 20 and is preferably made of, for example, silicon dioxide (SiO$_2$) or polyimide (PI). A wiring portion 50 to electrically connect the resonant sections 12 and 13 adjacent to each other is provided as required on surfaces of the support layers 30. Although not illustrated in the drawings, reflectors may be disposed on the piezoelectric thin film 20 on both sides of the IDT electrode 40 (as viewed in the Y-axis direction in FIG. 1).

Furthermore, as illustrated in the sectional view of FIG. 2, a projection 35 projecting toward the support substrate 10 from each of the resonant sections 12 and 13 is provided in an edge portion of a surface (lower surface) of the support layer 30 on a side facing the support substrate 10. As described later with reference to FIGS. 8A to 8E and 9A to 9E, the projection 35 is formed, in a process of manufacturing the acoustic wave device 100, by filling the material of the support layer 30 into a recess formed in the support substrate 10. With the projection 35, the support layer 30 is fixed to the support substrate 10, and shrinkage of the support layer 30 due to a heat load is reduced or prevented. Accordingly, heat stress generated between the support layer 30 and the piezoelectric thin film 20 can be reduced. Moreover, when polyimide is used as the support layer 30, shrinkage caused when the polyimide is cured in the manufacturing process can be reduced or prevented with the presence of the projection 35, and a crack can be prevented from generating between the piezoelectric thin film 20 and the support layer 30.

In Preferred Embodiment 1, as illustrated in FIG. 2, the piezoelectric thin films 20 in the adjacent resonant sections 12 and 13 are divided by the support layer 30 with the lower linear expansion coefficient than the piezoelectric thin films 20. Therefore, even when a temperature difference occurs between the piezoelectric thin films 20 in the two resonant sections 12 and 13, the support layers 30 surrounding the piezoelectric thin films 20 can reduce or prevent deformation of one of the piezoelectric thin films from affecting the other piezoelectric thin film. As a result, degradation of the TCF characteristics can be reduced or prevented.

Preferred Embodiment 2

Although Preferred Embodiment 1 has a structure in which the piezoelectric thin films 20 in the individual resonant sections are directly disposed on the support substrate 10, another layer may be disposed between each piezoelectric thin film 20 and the support substrate 10 as long as the piezoelectric thin films 20 are divided.

Figure 3:
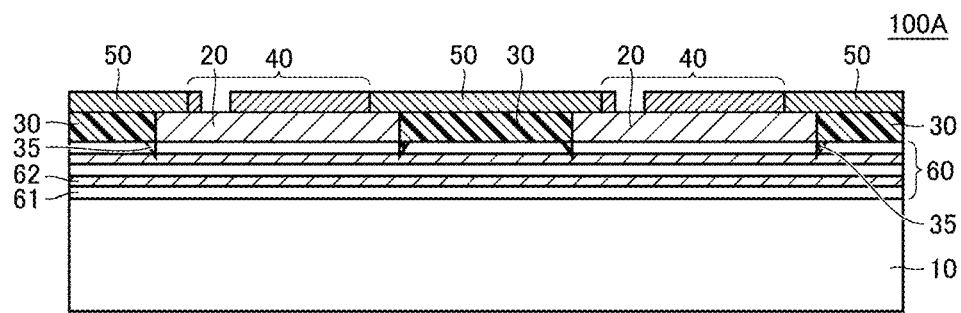
FIG. 3 is a sectional view of an acoustic wave device according to Preferred Embodiment 2 of the present invention.

FIG. 3 is a sectional view of an acoustic wave device 100A according to Preferred Embodiment 2 of the present invention. The acoustic wave device 100A is different from the acoustic wave device 100 according to Preferred Embodiment 1 in that an intermediate layer 60 is disposed between both of the piezoelectric thin film 20 and the support layer 30 and the support substrate 10. The projection 35 of the support layer 30 is located in the intermediate layer 60.

The intermediate layer 60 includes at least a high acoustic velocity layer 62 enabling propagation of an acoustic bulk wave therethrough, which has a higher velocity than an acoustic wave propagating through the piezoelectric thin film 20. The high acoustic velocity layer 62 can be made of, for example, one of a DLC (Diamond-like Carbon) film, piezoelectric bodies such as nitride, aluminum oxide, silicon carbide, silicon nitride, silicon, sapphire, lithium tantalate, lithium niobate, and quartz, various ceramics such as alumina, zirconia, cordierite, mullite, steatite, and forsterite, magnesia diamond, materials including the above-described materials as main components, and materials including mixtures of two or more of the above-described materials as main components. With the high acoustic velocity layer 62, energy of the acoustic wave excited by the IDT electrode 40 into the piezoelectric thin film 20 can be effectively confined within the piezoelectric thin film 20.

The intermediate layer 60 may further include, in addition to the high acoustic velocity layer 62, a low acoustic velocity layer 61 laminated on the high acoustic velocity layer 62 and enabling propagation of an acoustic bulk wave therethrough, which has a lower velocity than the acoustic wave propagating through the piezoelectric thin film 20. The low acoustic velocity layer 61 may be made of, for example, one of compounds obtained by adding fluorine, carbon, or boron to silicon oxide, glass, silicon oxynitride, tantalum oxide, or silicon oxide, and materials including the above-described materials as main components. FIG. 3 represents an example in which the intermediate layer 60 is a multilayer body obtained by alternately laminating the low acoustic velocity layer 61 and the high acoustic velocity layer 62.

With the above-described structure, since the acoustic wave is reflected at an interface between the low acoustic velocity layer 61 and the high acoustic velocity layer 62 and an interface between the piezoelectric thin film 20 and the high acoustic velocity layer 62, the energy of the acoustic wave excited by the IDT electrode 40 can be effectively confined within the piezoelectric thin film 20 and the low acoustic velocity layer 61.

If the thickness of the piezoelectric thin film 20 is thick, a rate of influence of the material (for example, lithium tantalate) of the piezoelectric thin film 20 increases and the acoustic wave in a thickness direction of the substrate is more likely to leak. Furthermore, if the thickness of the piezoelectric thin film 20 increases, a rate of influence of the linear expansion coefficient of the piezoelectric thin film 20 also increases. Therefore, the TCF characteristics may degrade with an increase in the thickness of the piezoelectric thin film 20. In addition, since the benefit of the support substrate 10 (for example, silicon) with high thermal conductivity is less likely to develop, the TCF characteristics may further degrade.

Where a wavelength of the acoustic wave determined from the electrode period of the IDT electrode 40 is denoted by λ, the thickness of the piezoelectric thin film 20 is preferably about 3.5λ or less, for example. Under this condition, a Q-value can be increased. The TCF characteristics can be improved by setting the thickness of the piezoelectric thin film 20 to be about 2.5λ or less, for example, and adjustment of the acoustic velocity can be facilitated by setting the thickness of the piezoelectric thin film 20 to be about 1.5λ or less, for example.

Regarding the thickness of the low acoustic velocity layer 61, by setting the thickness to be about 2.0λ or less, for example, film stress can be reduced and warping of the substrate can be reduced. As a result, a product acceptance rate of the acoustic wave device can be increased, and stabilization of the characteristics can be achieved.

When the thickness of the high acoustic velocity layer 62 is thin and the acoustic velocity in the support substrate 10 is slow, the acoustic surface wave is more likely to leak to the support substrate 10. The influence of such bulk radiation may degrade the characteristics of the acoustic wave device in some cases. Since the function of confining the energy of the acoustic wave within the piezoelectric thin film 20 and the low acoustic velocity layer 61 is developed by the high acoustic velocity layer 62, the thickness of the high acoustic velocity layer 62 is preferably set as thick as possible.

Although, in the structure of FIG. 3, the high acoustic velocity layer is disposed in the intermediate layer 60, the support substrate 10 itself may be provided using the material of the high acoustic velocity layer and the intermediate layer 60 may be provided using the material of the low acoustic velocity layer. In another example, the intermediate layer 60 formed by laminating the high acoustic velocity layer and the low acoustic velocity layer may be disposed between the support substrate 10 provided using the material of the high acoustic velocity layer and the piezoelectric thin film 20.

Although Preferred Embodiment 2 has been described in connection with an example in which the intermediate layer 60 includes the high acoustic velocity layer and the low acoustic velocity layer that are defined based on a relative velocity difference between the velocity of the bulk acoustic wave propagating through each of those layers and the velocity of the acoustic wave propagating through the piezoelectric thin film 20, another structure may also be provided to confine the energy of the acoustic wave.

In a modification of Preferred Embodiment 2, the intermediate layer 60 may be defined by alternately laminating layers of which acoustic impedances are relatively different from each other. More specifically, a portion corresponding to the low acoustic velocity layer 61 in FIG. 3 is provided as a low impedance layer (first layer) with relatively low acoustic impedance, and a portion corresponding to the high acoustic velocity layer 62 is provided as a high impedance layer (second layer) with relatively high acoustic impedance. With such a structure, since the acoustic wave is reflected at an interface between the low impedance layer and the high impedance layer, the energy of the acoustic wave excited by the IDT electrode 40 can be effectively confined within the piezoelectric thin film 20.

Preferred Embodiment 3

Although Preferred Embodiment 2 has the structure in which the two resonant sections 12 and 13 are disposed on the common intermediate layer 60, the intermediate layer 60 is not always required to be disposed in common for a plurality of resonant sections.

Preferred Embodiment 3 of the present invention is described in connection with a structure in which the intermediate layer is also divided by the support layer, similar to the piezoelectric thin film.

Figure 4:
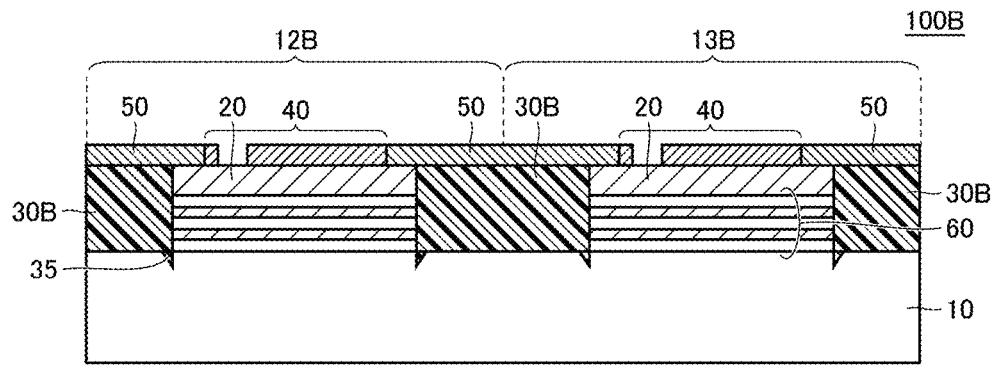
FIG. 4 is a sectional view of an acoustic wave device according to Preferred Embodiment 3 of the present invention.

FIG. 4 is a sectional view of an acoustic wave device 100B according to Preferred Embodiment 3. Referring to FIG. 4, in the acoustic wave device 100B, a support layer 30B disposed around the piezoelectric thin film 20 in each resonant section extends to the support substrate 10, thus resulting in a state in which the intermediate layer 60 is divided by the support layer 30B. In other words, a portion of the intermediate layer 60 between the piezoelectric thin film 20 and the support substrate 10 in a first resonant section 12B and a portion of the intermediate layer 60 between the piezoelectric thin film 20 and the support substrate 10 in a second resonant section 13B are divided by the support layer 30B between the first resonant section 12B and the second resonant section 13B. In this case, the projection 35 disposed in an edge portion of a lower surface of the support layer 30B is disposed in the support substrate 10. A structure of the intermediate layer 60 is the same as or similar to that in Preferred Embodiment 2, and it may be a combination of the low acoustic velocity layer and the high acoustic velocity layer or a combination of the high impedance layer and the low impedance layer.

Thus, also in the structure in which the intermediate layer 60 is divided for each of the resonant sections, the energy of the acoustic wave excited by the IDT electrode 40 can be effectively confined within the piezoelectric thin film 20 with the presence of the intermediate layer 60.

Figure 5:
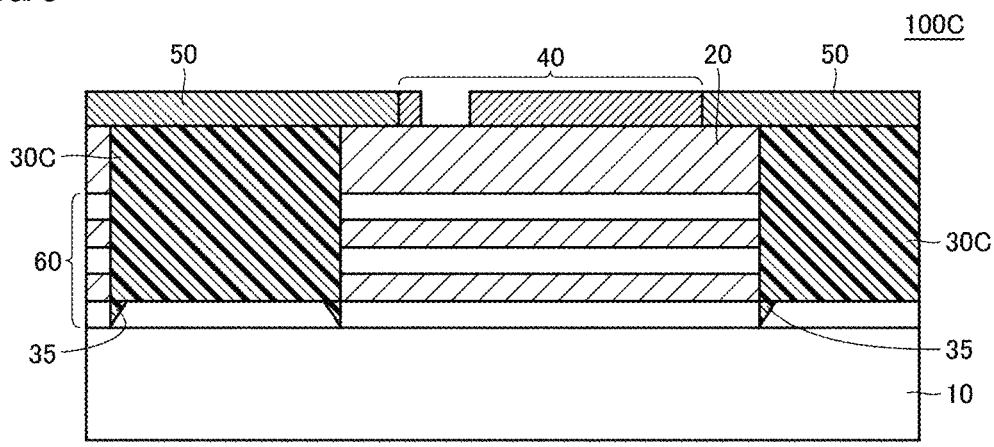
FIG. 5 is an explanatory view illustrating a first modification of a support layer.

A position of the lower surface of the support layer 30B dividing the intermediate layer 60 is not always required to be matching with the boundary between the support substrate 10 and the intermediate layer 60 as in FIG. 4. For example, as in an acoustic wave device 100C illustrated in FIG. 5, a lower surface of a support layer 30C may be positioned closer to the intermediate layer 60 than the boundary between the support substrate 10 and the intermediate layer 60. In this case, damage to the support substrate 10 can be reduced or prevented by positioning the projection 35 so as not to extend into the support substrate 10.

Figure 6:
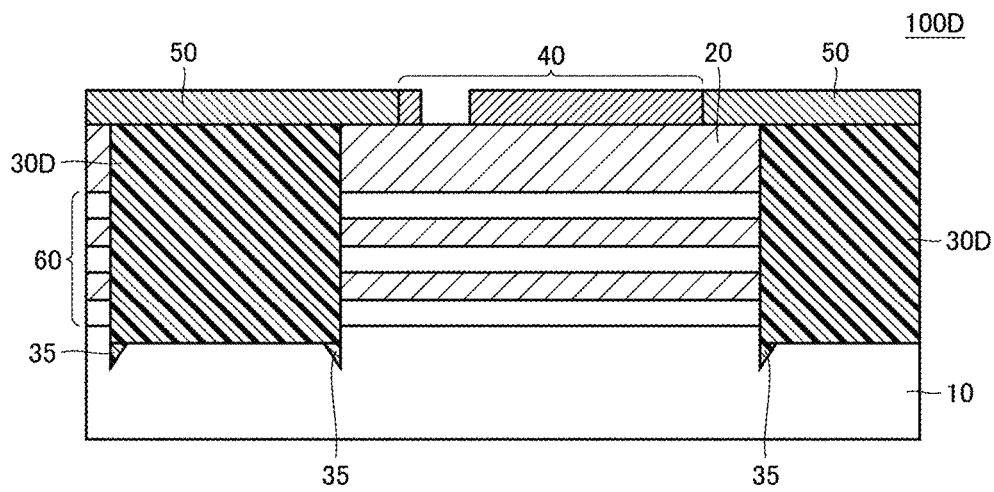
FIG. 6 is an explanatory view illustrating a second modification of the support layer.
Figure 7:
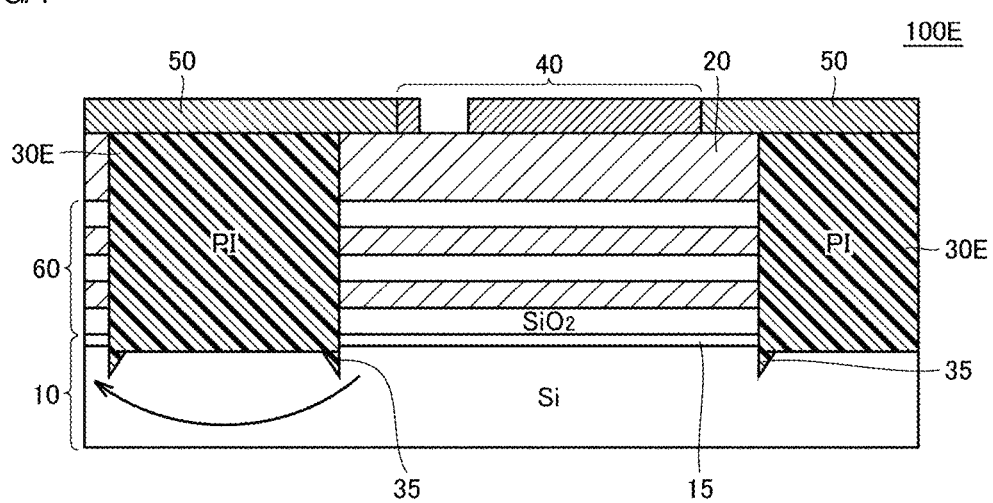
FIG. 7 is an explanatory view illustrating a third modification of the support layer.

Instead, as in an acoustic wave device 100D illustrated in FIG. 6, a lower surface of a support layer 30D may be positioned at an inner side of the support substrate 10 (in a first direction) farther inward than the boundary between the support substrate 10 and the intermediate layer 60. In particular, when silicon is used as the support substrate 10 and silicon dioxide is used as the low acoustic velocity layer 61 as in an acoustic wave device 100E illustrated in FIG. 7, it is known that a layer generating charges (charge generation layer 15) is produced at an interface between the support substrate 10 and the high acoustic velocity layer 62. In such a case, charges accumulated in the charge generation layer 15 can be effectively reduced or prevented from moving to the adjacent resonant section by using polyimide as a support layer 30E and by arranging a lower surface of the support layer 30E to be positioned at an inner side of the support substrate 10 farther inward than the boundary between the support substrate 10 and the intermediate layer 60.

Manufacturing Process of Acoustic Wave Device

A non-limiting example of a manufacturing process of the acoustic wave device 100B illustrated in FIG. 4 will be described below with reference to FIGS. 8A to 8E and 9A to 9E. FIGS. 8A to 8E illustrate examples of a manufacturing process in which the IDT electrode 40 is formed before forming the support layer 30B, and FIGS. 9A to 9E illustrate examples of a manufacturing process in which the IDT electrode 40 is formed after forming the support layer 30B.

First Process Example

Figure 8A:
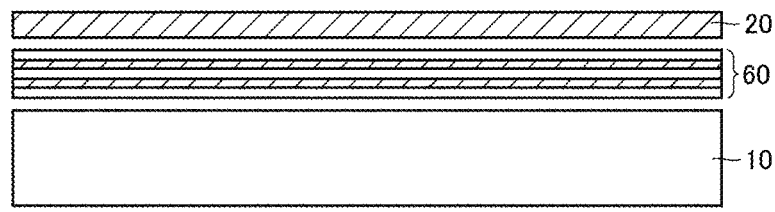
FIGS. 8A to 8E are explanatory views illustrating a first example of a manufacturing process for the acoustic wave device illustrated in FIG. 4.
Figure 8B:
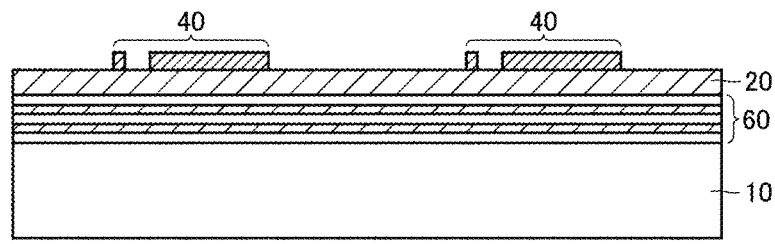

Referring to FIG. 8A, first, a substrate serving as a basic structure of the acoustic wave device is formed by preparing the support substrate 10, the intermediate layer 60, and the piezoelectric thin film 20, and by bonding the support substrate and the piezoelectric thin film 20 to each other with the intermediate layer 60 interposed therebetween. When the multilayer body including the high acoustic velocity layer and the low acoustic velocity layer is used as the intermediate layer 60, a process of forming the intermediate layer 60 using the high acoustic velocity layer and the low acoustic velocity layer prior to the process of FIG. 8A is included.

Then, the IDT electrode 40 is formed on the surface of the piezoelectric thin film 20 in the substrate (FIG. 8B) that has been formed in FIG. 8A. When functional elements (such as a capacitor and a reflector) other than the IDT electrode 40 are disposed on the piezoelectric thin film 20, the functional elements are also formed in the step of FIG. 8B.

Figure 8C:
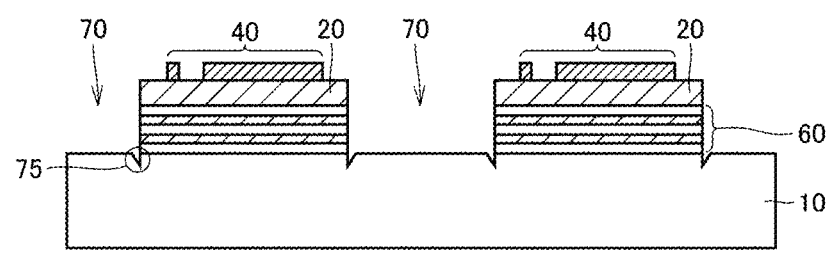

After forming the functional elements, such as the IDT electrode 40, on the piezoelectric thin film 20, a mask is formed in a region of a substrate surface where the piezoelectric thin film 20 and the intermediate layer 60 are to remain, and, for example, dry etching is performed to remove, as illustrated in FIG. 8C, the piezoelectric thin film 20 and the intermediate layer 60 in a region where the support layer 30B is to be formed. At a boundary portion between a cavity 70 formed as described above and the intermediate layer 60, a recess 75 is formed in the support substrate 10 by performing, for example, dry etching in a state in which the boundary portion is covered with a resist except for a region where the recess 75 is to be formed. A position of the lower surface of the support layer is adjusted, as illustrated in FIGS. 3 to 7, depending on how far the etching in FIG. 8C is performed.

Figure 8D:
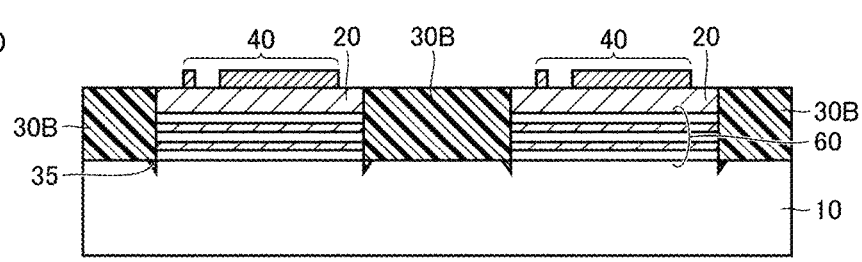

Then, as illustrated in FIG. 8D, the support layer 30B is formed by filling, for example, polyimide into the cavity 70 that has been formed by the etching. When silicon dioxide ($SiO_2$) is used as the support layer 30B, the support layer 30B is formed by a film deposition process, for example. At that time, the material of the support layer 30B is filled into the recess 75 that has been formed in FIG. 8C, such that the projection 35 of the support layer 30B is formed (FIG. 8D).

Figure 8E:
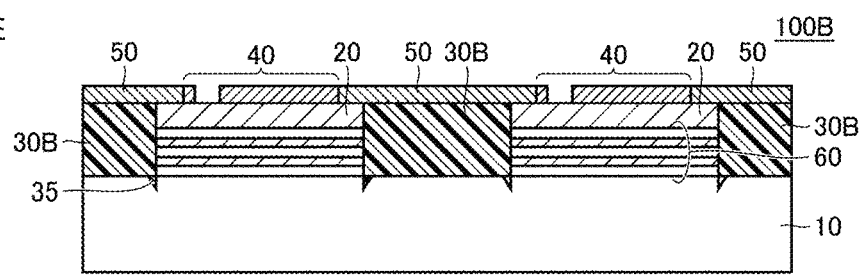

Then, the mask on the substrate surface is removed and the acoustic wave device 100B is obtained by forming the wiring portion 50 on the support layer 30B (FIG. 8E).

Second Process Example

Figure 9A:
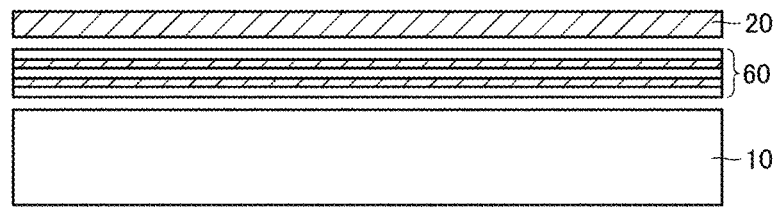
FIGS. 9A to 9E are explanatory views illustrating a second example of the manufacturing process for the acoustic wave device illustrated in FIG. 4.
Figure 9B:
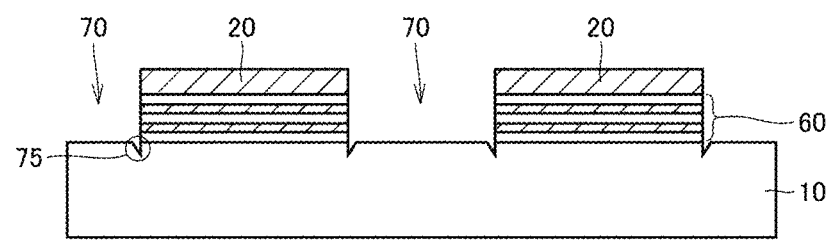
Figure 9C:
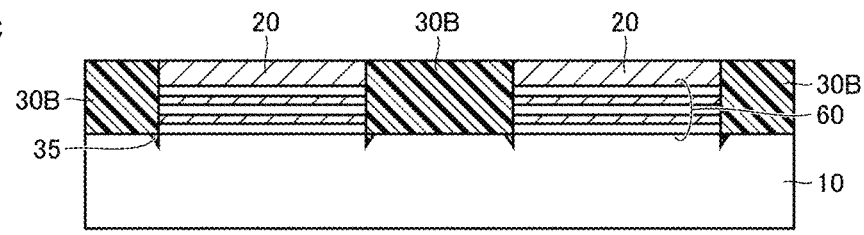

In a non-limiting example of a manufacturing process illustrated in FIGS. 9A to 9E, after the substrate has been formed by bonding the support substrate 10, the intermediate layer 60, and the piezoelectric thin film 20 in FIG. 9A, a mask is formed in a region where the functional elements, such as the IDT electrode 40, are to be formed, and dry etching is performed to remove the piezoelectric thin film 20 and the intermediate layer 60 in the region where the support layer 30B is to be formed (FIG. 9B). At that time, the position of the lower surface of the support layer is adjusted depending on how far the dry etching is performed, as described above with reference to FIGS. 8A to 8E.

Figure 9D:
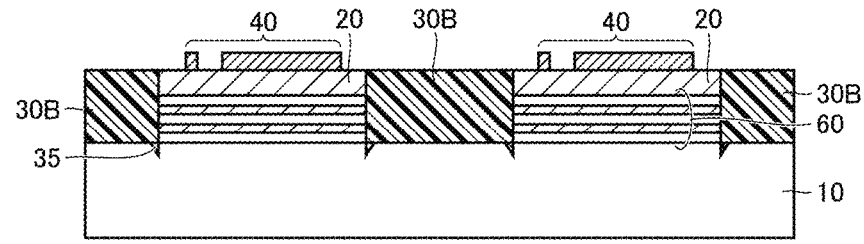

Then, the support layer 30B is formed by filling the material of the support layer into a cavity 70 that has been formed by removing the piezoelectric thin film 20 and the intermediate layer 60 (FIG. 9C), and the functional elements, such as the IDT electrode 40, are formed on the piezoelectric thin film 20 (FIG. 9D).

Figure 9E:
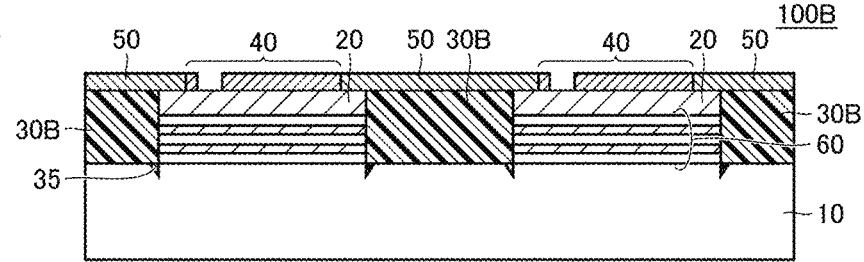

Then, the acoustic wave device 100B is obtained by forming the wiring portion 50 on the support layer 30B (FIG. 9E).

Preferred Embodiment 4

Figure 10:
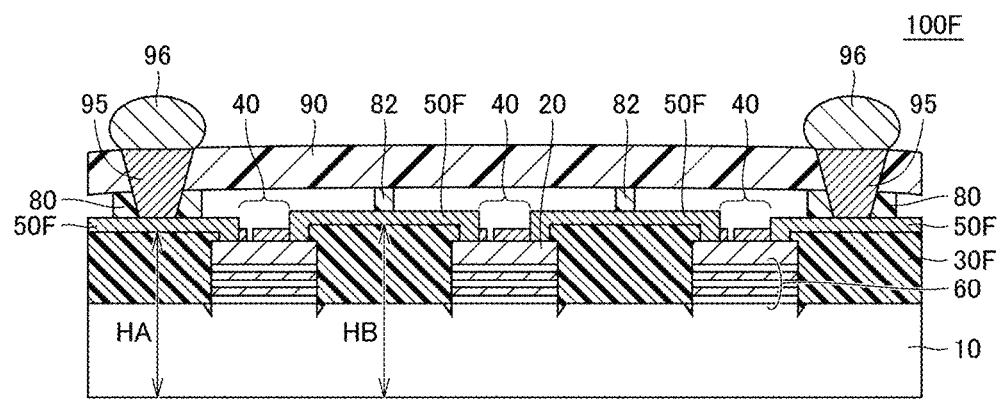
FIG. 10 is a sectional view of an acoustic wave device according to Preferred Embodiment 4 of the present invention.

FIG. 10 is a sectional view of an acoustic wave device 100F provided in a WLP (Wafer Level Package) structure according to Preferred Embodiment 4 of the present invention. In FIG. 10, three resonant sections are provided on the support substrate 10, and the piezoelectric thin films 20 and the intermediate layers 60 in the individual resonant sections are divided by support layers 30F.

The support layer 30F in the acoustic wave device 100F has a structure in which a surface of the support layer 30F on an opposite side to the support substrate 10 is positioned at a higher level than the piezoelectric thin film 20 and a portion of the support layer 30F overlaps with the surface of the piezoelectric thin film 20. When resin, such as polyimide, for example, is used as the support layer 30F, there is a possibility that thermal shrinkage may occur due to the difference in linear expansion coefficient between the support layer 30F and the piezoelectric thin film 20 when the resin is cooled to be solidified, and that a gap may be generated between the support layer 30F and each of the intermediate layer 60 and the piezoelectric thin film 20. However, the generation of such a gap can be prevented by providing the structure in which a portion of the support layer 30F overlaps with the surface of the piezoelectric thin film 20. It is thus possible to prevent the occurrence of disconnection in a wiring portion 50F that is provided on the upper surface of the support layer 30F.

In the acoustic wave device 100F, a support member 80 to support a cover portion 90 disposed on the upper side is provided on the support layer 30F at an outermost peripheral position to obtain the WLP structure. Resin, such as polyimide, for example, is used as the support member 80, and the support member 80 surrounds the entirety or substantially the entirety of the plurality of resonant sections that are disposed on the inner side. The cover portion 90 is made of, for example, resin such as epoxy or another suitable material such as insulating ceramic, and an inner space in which the resonant section including the IDT electrode 40 is able to vibrate is defined by the support member 80 and the cover portion 90.

Furthermore, a support member 82 to support the cover portion 90 is disposed on the support layer 30F that divides the resonant sections. With the support member 82, the inner space is prevented from collapsing due to deformation of the cover portion 90.

A through-hole extending to the wiring portion 50F provided on the upper surface of the support layer 30F at the outermost peripheral position is provided through both the support member 80 and the cover portion 90, and an under bump metal 95 is filled in the through-hole. For example, a conductive material such as Au, Ag, Cu or Ni is preferably used as the under bump metal 95. A solder bump 96 is connected to the under bump metal 95 such that the resonant section and an external device are electrically connected to each other through the under bump metal 95 and the solder bump 96.

The entirety of substantially the entirety of the acoustic wave device 100F described above is often molded with, for example, resin after being mounted to an external board or the like. In such a case, because pressure is applied to the cover portion 90 from the exterior, the cover portion 90 is more likely to deform. The deformation of the cover portion 90 is reduced or prevented by, as described above, disposing the support member 82 on the support layer 30F that divides the resonant sections. In this regard, durability against pressure applied from the exterior can be further increased by setting a thickness (denoted by HB in FIG. 10) of the support layer 30F on which the support member 82 is disposed to be greater than a thickness (denoted by HA in FIG. 10) of the support layer 30F at the outermost peripheral position (namely, HA<HB) such that a height of the cover portion 90 near a central region of the acoustic wave device 100F is higher than a height of the cover portion 90 in an outer peripheral region thereof (namely, such that the cover portion 90 has a convex shape, for example).

It is not necessarily required to set the thickness of the support layer 30F on which the support member 82 is disposed to be greater than the thickness of the support layer 30F at the outermost peripheral position. For example, when the pressure applied from the exterior is not so high, the thicknesses of the support layers 30F may be set to be the same or substantially the same, or the thickness of the support layer 30F at the outermost peripheral position may be set to be greater contrary to the above-described case.

Moreover, in the acoustic wave device 100F described above, a portion of the support layer 30F is configured to overlap with the surface of the piezoelectric thin film 20 to prevent the occurrence of disconnection in the wiring portion 50F. In this regard, stress applied to the wiring portion can be further reduced by appropriately configuring the shape of the wiring portion.

Figure 11:
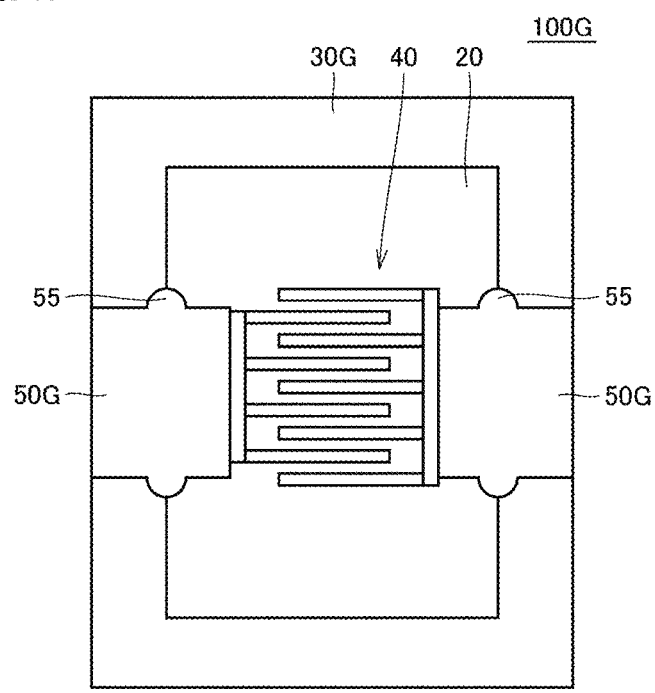
FIG. 11 illustrates an example of the shape of a wiring portion in a boundary region between the piezoelectric thin film and the support layer.

In an acoustic wave device 100G illustrated in FIG. 11, a protrusion 55 is provided in a portion of a wiring portion 50G, the portion being positioned in a boundary region between a support layer 30G and the piezoelectric thin film 20. With the wiring portion 50G including the protrusion 55, an area receiving the stress generated due to the difference in linear expansion coefficient between the support layer 30G and the piezoelectric thin film 20 increases, such that the occurrence of disconnection in the wiring portion 50G can be more effectively reduced or prevented. The protrusion 55 preferably has a curved shape as illustrated in FIG. 11 rather than a rectangular or substantially rectangular shape. The curved shape of the protrusion 55 can relieve the stress acting on a region where the protrusion 55 overlaps with the boundary region between the support layer 30G and the piezoelectric thin film 20.

The shape of the wiring portion 50G illustrated in FIG. 11 can be applied to Preferred Embodiments 1 to 3 as well.

Preferred Embodiment 5

When the intermediate layer configured to reflect the acoustic wave is provided by alternately laminating the high impedance layer with relatively high acoustic impedance and the low impedance layer with relatively low acoustic impedance, for example, tungsten (W), tantalum (Ta), niobium (Nb), or platinum (Pt) is preferably used as a material for the high impedance layer in some cases. Tungsten, tantalum, niobium, and platinum are materials that may cause electrochemical migration due to moisture or outside air. If the electrochemical migration occurs, the high impedance layer is partly damaged and can no longer reflect the acoustic wave appropriately, thus giving rise to a possibility that the characteristics of the acoustic wave device may change.

In consideration of the above point, Preferred Embodiment 5 of the present invention is described in connection with a structure in which the electrochemical migration is reduced or prevented from occurring in the high impedance layer in the intermediate layer by providing a protective layer in the acoustic wave device.

FIGS. 12A to 12D are sectional views of an acoustic wave device 100H according to Preferred Embodiment 5. FIGS. 12A to 12D illustrate variations of arrangements of the protective layer. For example, silicon oxide or silicon nitride is preferably used as a material of the protective layer.

First Example

Figure 12A:
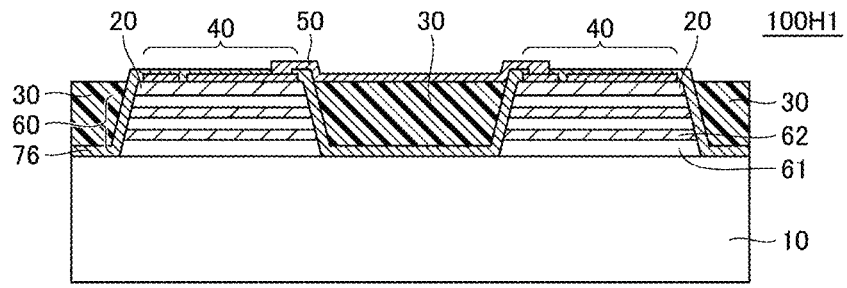
FIGS. 12A to 12D are sectional views of an acoustic wave device according to Preferred Embodiment 5 of the present invention.

In an acoustic wave device 100H1 illustrated in FIG. 12A, a protective layer 76 cover not only a lateral surface of a multilayer body including the support substrate 10, the intermediate layer 60, and the piezoelectric thin film 20, but also the surface of the piezoelectric thin film 20 on which the IDT electrode 40 is provided. Such a structure is provided by laminating, in the manufacturing process described with reference to FIGS. 8A to 8E, the protective layer 76 before the step of forming the support layer 30B (namely, between FIGS. 8C and 8D).

With the structure of the acoustic wave device 100H1, the support layer 30 and the intermediate layer 60 are isolated from each other by the protective layer 76, and the surface of the piezoelectric thin film 20 is sealed from the outside air. Accordingly, moisture or the like permeating through the support layer 30 or the piezoelectric thin film 20 can be prevented from reaching the high impedance layer 62 with the presence of the protective layer 76. As a result, the occurrence of the electrochemical migration in the material forming the high impedance layer 62 can be reduced or prevented.

Second Example

Figure 12B:
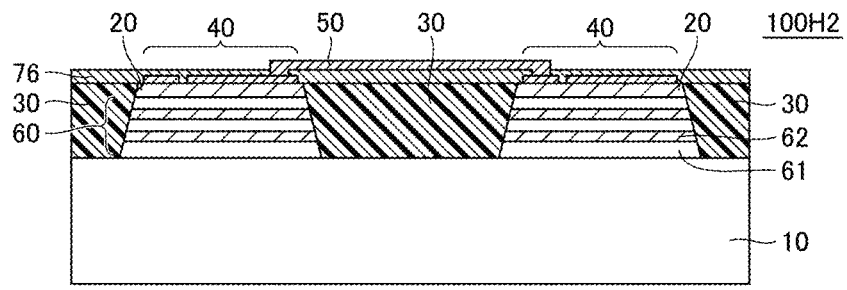

In an acoustic wave device 100H2 illustrated in FIG. 12B, the protective layer 76 covers surfaces of both the support layer 30 and the piezoelectric thin film 20. Furthermore, the wiring portion 50 is provided on an upper surface of the protective layer (namely, a surface of the protective layer 76 on an opposite side to the piezoelectric thin film 20). The wiring portion 50 is connected to the IDT electrode 40 disposed on the piezoelectric thin film 20 through an opening that is provided in the protective layer 76.

The above-described structure is provided by laminating the protective layer 76 after the step of FIG. 8D or FIG. 9D.

With the structure of the acoustic wave device 100H2, the support layer 30 and the piezoelectric thin film 20 can be prevented from being exposed to the outside air, and moisture can be prevented from permeating through the support layer 30 and the piezoelectric thin film 20. Thus, the occurrence of the electrochemical migration in the material of the high impedance layer 62 can be reduced or prevented.

Third Example

Figure 12C:
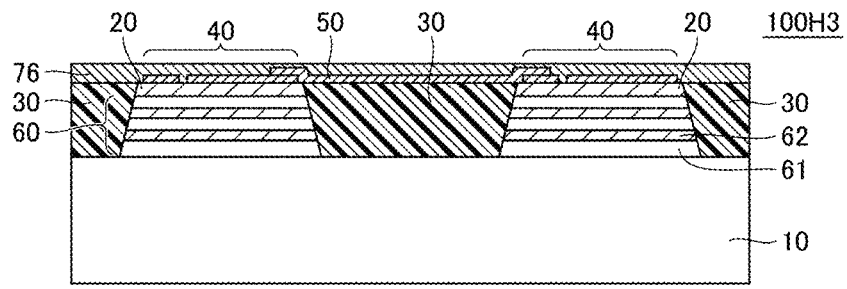

In an acoustic wave device 100H3 illustrated in FIG. 12C, the wiring portion 50 is further covered with the protective layer 76 in addition to the surfaces of both the support layer 30 and the piezoelectric thin film 20. Such a structure is provided by laminating the protective layer 76 after the step of FIG. 8E or FIG. 9E.

With the structure of the acoustic wave device 100H3, since the wiring portion 50 is also covered with the protective layer 76, it is not necessary to provide an opening in the protective layer 76 for electrical conduction to the wiring portion 50 unlike the acoustic wave devices 100H1 and 100H2. Therefore, moisture can be more reliably prevented from reaching the high impedance layer 62 through the opening. As a result, the occurrence of the electrochemical migration in the material of the high impedance layer 62 can be reduced or prevented.

Fourth Example

Figure 12D:
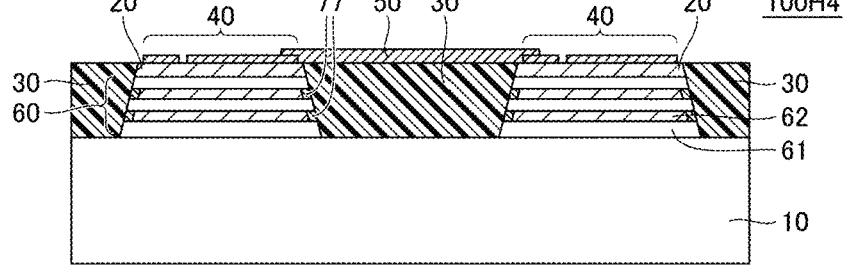

In FIG. 12D, a protective layer 77 is provided only in a boundary region between the high impedance layer 62 (second layer) and the support layer 30 in the intermediate layer 60. The protective layer 77 may be provided by forming a film of a similar material to that used in the above-described first to third examples, such as silicon oxide or silicon nitride, for example, at an end portion of the high impedance layer 62. When tungsten is used as the material of the high impedance layer 62, the protective layer 77 may be formed by, for example, oxidizing or nitriding the end portion of the tungsten.

With the protective layer 77 provided in the boundary region between the high impedance layer 62 and the support layer as described above, the occurrence of the electrochemical migration in the material of the high impedance layer 62 can be reduced or prevented.

Preferred Embodiment 6

The above-described preferred embodiments have been described with reference to the structure of the acoustic wave device in which a pair of adjacent resonant sections are connected to each other by the wiring portion.

Preferred Embodiment 6 of the present invention is described with respect to an arrangement of the wiring portions in the structure of the acoustic wave device in which two pairs of resonant sections are disposed in a crossed relationship.

Figure 13A:
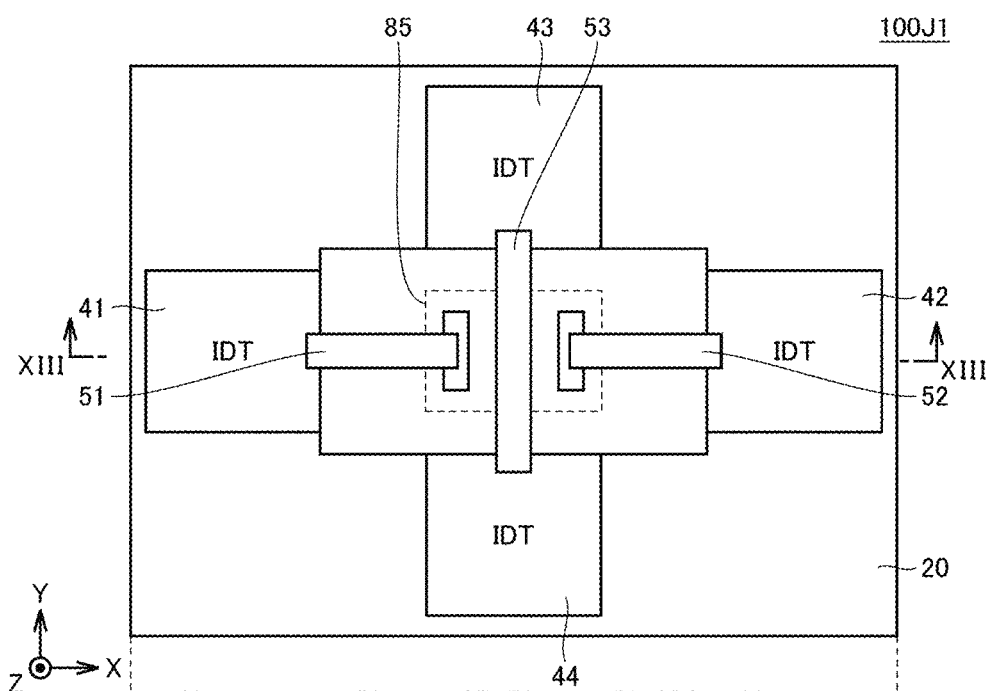
FIGS. 13A and 13B illustrate an acoustic wave device according to Preferred Embodiment 6 of the present invention.
Figure 13B:
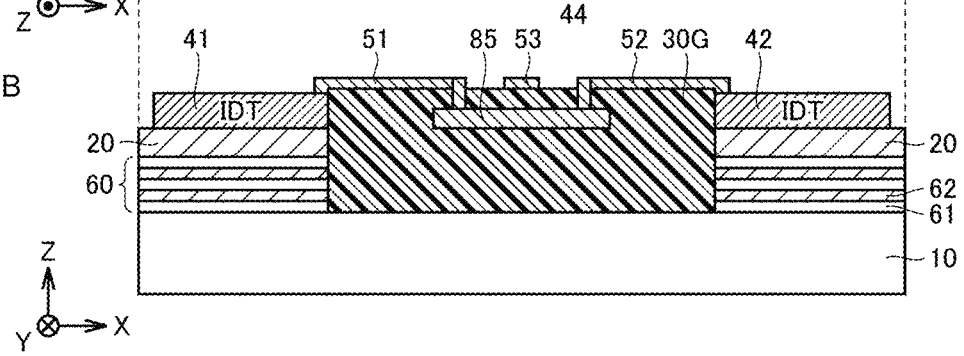

FIGS. 13A and 13B illustrate an acoustic wave device 100J1 according to Preferred Embodiment 6. In FIGS. 13A and 13B, a plan view of the acoustic wave device 100J1 is illustrated in an upper zone (FIG. 13A), and a sectional view taken along a plane XIII-XIII in the plan view is illustrated in a lower zone (FIG. 13B).

Referring to FIGS. 13A and 13B, the acoustic wave device 100J1 includes four IDT electrodes 41 to 44 disposed on the piezoelectric thin film 20. The resonant section is provided for each of the IDT electrodes. In each of the resonant sections, as in FIG. 3 and so on, the piezoelectric thin film 20 is disposed on the support substrate 10 with the intermediate layer 60 interposed therebetween, and the IDT electrode is provided on the piezoelectric thin film 20.

In the acoustic wave device 100J1, the four resonant sections are adjacent to each other with a common support layer 30G interposed between the adjacent resonant sections. More specifically, the IDT electrode 41 and the IDT electrode 42 are adjacent to each other in the X-axis direction with the support layer 30G interposed therebetween, and the IDT electrode 43 and the IDT electrode 44 are adjacent to each other in in the Y-axis direction with the support layer 30G interposed therebetween.

When the IDT electrode 41 and the IDT electrode 42 are connected and the IDT electrode 43 and the IDT electrode 44 are connected in the above-described arrangement of the resonant sections, the wiring portions for connecting the adjacent IDT electrodes cross each other. In such a case, if the two wiring portions are disposed in the same plan, those wiring portions are short-circuited. It is thus necessary to arrange one of the two wiring portions along a long bypassing path. Such an arrangement increases an area of the entire acoustic wave device and prevents size reduction of an apparatus including the acoustic wave device.

In consideration of the above-described point, the acoustic wave device 100J1 is configured as follows. When the two wiring portions cross each other, those two wiring portions are provided in different layers to be three-dimensionally arranged in a crossing region between the two wiring portions. With this arrangement, insulation between the wiring portions is ensured while an increase in the size of the acoustic wave device is reduced or prevented.

More specifically, in the acoustic wave device 100J1, as illustrated in FIG. 13B, a metal layer 85 is provided inside the support layer 30G, and the IDT electrode 41 and the IDT electrode 42 are connected by wiring portions 51 and 52 both provided on a surface of the support layer 30G and by the metal layer 85. On the other hand, the IDT electrode 43 and the IDT electrode 44 are connected by a wiring portion 53 provided on the surface of the support layer 30G in a region between the wiring portion 51 and the wiring portion 52. Stated in a different way, a path connecting the IDT electrode 41 and the IDT electrode 42 and a path connecting the IDT electrode 43 and the IDT electrode 44 are insulated by an insulating material defining the support layer 30G in a region where both the paths cross each other in a plan view of the acoustic wave device 100J1.

With the arrangement described above, it is possible not only to reduce or prevent an increase in the size of the acoustic wave device, but also to ensure the insulation between the wiring portions.

Although the above description of FIGS. 13A and 13B has been provided, by way of example, in connection with the case in which two wirings each connecting the IDT electrodes cross each other, the above-described arrangement is not limited to the wirings connecting the IDT electrodes and can be further applied to another region in the acoustic wave device where two wirings cross each other. The above-described arrangement may be applied to, for example, the case in which a wiring extending from the IDT electrode to a circuit end terminal crosses another wiring, or the case in which two wirings extending from one IDT electrode cross each other.

Figure 14:
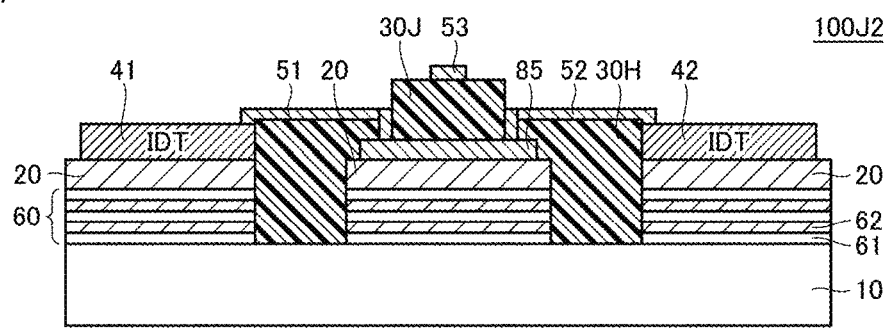
FIG. 14 is a sectional view of an acoustic wave device according to a modification of Preferred Embodiment 6 of the present invention.

FIG. 14 is a sectional view of an acoustic wave device 100J2 according to a modification of Preferred Embodiment 6. In the above-described acoustic wave device 100J1, the metal layer 85 is provided inside the support layer 30G. In the acoustic wave device 100J2 according to the modification, however, the metal layer 85 is provided, as in the resonant section, on the piezoelectric thin film 20 that is provided on the intermediate layer 60.

A support layer 30H is disposed around the intermediate layer 60 above which the metal layer 85 is provided, and the IDT electrodes are adjacent to each other with the support layer 30H interposed therebetween. As in the acoustic wave device 100J1, the IDT electrode 41 and the IDT electrode 42 are connected by the wiring portions 51 and 52 both provided on a surface of the support layer 30H and by the metal layer 85. Furthermore, a support layer 30J is disposed on the metal layer 85, and a wiring portion 53 for connecting the IDT electrode 43 and the IDT electrode 44 is provided on a surface of the support layer 30J.

With the above-described structure, as in the acoustic wave device 100J1, since the crossing region between the wiring portions can be provided three-dimensionally, it is possible not only to reduce or prevent an increase in the size of the acoustic wave device, but also to ensure the insulation between the wiring portions.

In addition, with the above-described structure of the acoustic wave device 100J2, when the metal layer 85 is made using the same material as that of the IDT electrode, the crossing region including the metal layer 85 can be formed at the same time as in the step of manufacturing the resonant sections. As a result, an additional step of forming the crossing region can be omitted.

Preferred Embodiment 7

A metal film is often used as the high impedance layer in the intermediate layer. In such a case, if the metal film is disposed opposite to the wiring portion, a capacitor is provided between the wiring portion and the metal film. When the resonator is an SMR (Solidly Mounted Resonator) in which a high impedance layer and a low impedance layer are arranged alternately, a metal film is provided at a position opposite to the IDT electrode in order to reflect the acoustic wave in the intermediate layer. Therefore, if the metal layer disposed opposite to the wiring portion and the metal layer disposed opposite to the IDT electrode are electrically connected to each other, this may bring about a state in which a capacitor is connected to a SAW resonator in parallel.

When the acoustic wave device is a ladder filter including a serial arm circuit and a parallel arm circuit, filter characteristics may be affected by a resonator to which a capacitor is connected in parallel.

With respect to an acoustic wave device configured as a ladder filter, Preferred Embodiment 7 of the present invention is described with respect to a structure to reduce an influence on filter characteristics when a metal film is used as the high impedance layer.

Figure 15:
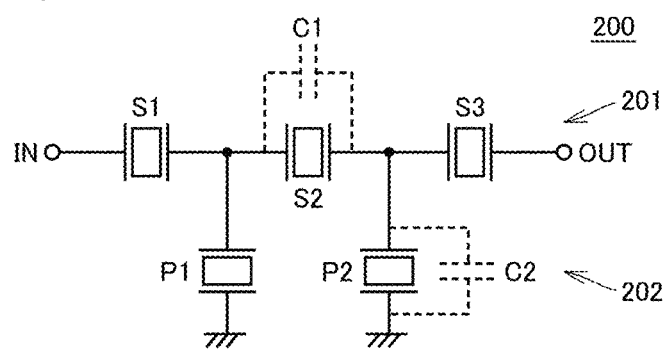
FIG. 15 is a circuit diagram illustrating an example of a ladder filter according to Preferred Embodiment 7 of the present invention.
Figure 16:
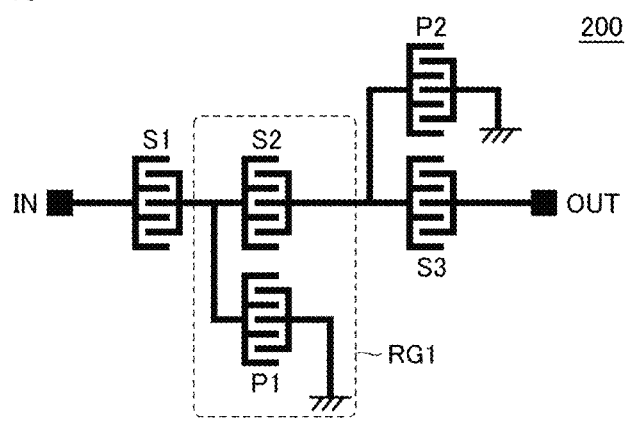
FIG. 16 is a schematic plan view of the acoustic wave device illustrated in FIG. 15.

FIG. 15 is a circuit diagram illustrating an example of a ladder filter 200 (hereinafter referred to simply as a "filter 200") according to Preferred Embodiment 7. FIG. 16 is a schematic plan view of the acoustic wave device (filter) illustrated in FIG. 15.

Referring to FIGS. 15 and 16, the filter 200 includes a serial arm circuit 201 connected between an input terminal IN and an output terminal OUT, and a parallel arm circuit 202 connected between the serial arm circuit 201 and a ground potential.

The serial arm circuit 201 includes serial arm resonators S1 to S3 connected in series between the input terminal IN and the output terminal OUT. The parallel arm circuit 202 includes parallel arm resonators P1 and P2. The parallel arm resonator P1 is connected between the ground potential and a connection node between the serial arm resonator S1 and the serial arm resonator S2. The parallel arm resonator P2 is connected between the ground potential and a connection node between the serial arm resonator S2 and the serial arm resonator S3. The configurations of the serial arm circuit 201 and the parallel arm circuit 202 in the filter 200 are not limited to those illustrated in FIG. 15, and those circuits may have any other suitable configurations. It is to be noted that, in the filter 200, each of the serial arm resonators and the parallel arm resonators corresponds to the resonant section in the above-described preferred embodiments.

According to the above-described ladder filter 200, a band pass filter with a pass band covering a frequency band from a resonant frequency Frp of the parallel arm resonator to an anti-resonant frequency Fas of the serial arm resonator is defined by setting a resonant frequency Frs of the serial arm resonator and an anti-resonant frequency Fap of the parallel arm resonator to be positioned near a center frequency of a target pass band.

On that occasion, the pass band can be widened by increasing a difference between the resonant frequency Fr and the anti-resonant frequency Fa in each resonator (namely, a band width ratio=(Fa−Fr)/Fr). On the other hand, on a higher frequency side of the pass band, higher sharpness of attenuation characteristics between the pass band and an attenuation band is demanded in some cases for the purpose of increasing an S/N ratio. It is generally known that reducing the band width ratio is effective to improve the above-described sharpness.

As described above, an attenuation pole on the higher frequency side of the pass band is determined by the serial arm resonator. Therefore, reducing the band width ratio of the serial arm resonator and increasing the band width ratio of the parallel arm resonator is effective to obtain both the widening of the pass band and the higher sharpness of the attenuation characteristics on the higher frequency side.

In each resonator (resonant section), when a metal film 65 is provided as the high impedance layer 62 in the intermediate layer 60, this brings about a state in which a capacitor is connected to the resonator in parallel (as denoted by, for example, C1 or C2 in FIG. 15). If a capacitor is connected to the resonator in parallel, the band width ratio generally reduces because the anti-resonant frequency shifts toward a lower frequency side. It is thus preferable to reduce the influence of the metal film on the parallel arm resonator for which a larger band width ratio is desired.

Figure 17:
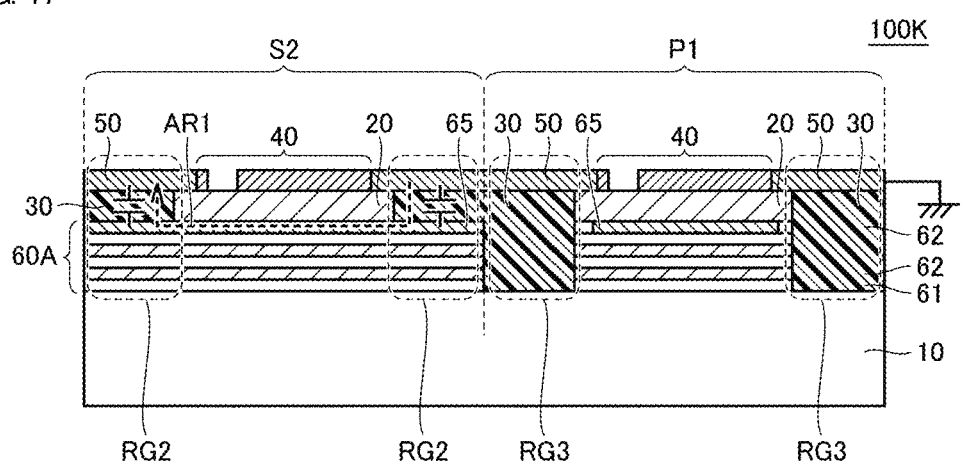
FIG. 17 is a sectional view of a portion denoted by a region RG1 illustrated in FIG. 16.

FIG. 17 is a sectional view of an acoustic wave device 100K according to Preferred Embodiment 7 in a portion denoted by a region RG1 including the serial arm resonator S2 and the parallel arm resonator P1 in FIG. 16. Referring to FIG. 17, the acoustic wave device 100K is configured by adding, to the structure in which the piezoelectric thin film 20 and the support layer 30 are provided on the intermediate layer 60 as illustrated in FIG. 3, the metal film 65 to be provided as the high impedance layer 62 that is an uppermost layer in the intermediate layer 60. The position at which the metal film 65 is to be included in the intermediate layer 60 is not limited to the uppermost high impedance layer 62. The metal film 65 may be disposed in any one of the layers of the intermediate layer 60, or at an interface between two adjacent layers.

In FIG. 17, the resonant section on the left side corresponds to the serial arm resonator S2, and the resonant section on the right side corresponds to the parallel arm resonator P1. In the serial arm resonator S2, the metal film 65 is provided in an intermediate layer 60A over a region including the piezoelectric thin film 20 and the support layer 30. On the other hand, in the parallel arm resonator P1, the metal film 65 is provided in a region opposite to the IDT electrode 40, but it is not provided in a region opposite to the wiring portion 50. Thus, in a plan view of the acoustic wave device 100K, the wiring portion 50 and the metal film 65 do not overlap with each other in the parallel arm resonator P1.

As illustrated in an example of FIG. 17, the parallel arm resonator P1 may be configured such that the intermediate layer 60A is not disposed between the wiring portion 50 and the support substrate 10, and that the support layer 30 extends from the wiring portion 50 to the support substrate 10.

When the band width ratio of the parallel arm resonator P1 is to be further increased, it is preferable that the metal film 65 is not provided in a region under the wiring portion 50 of the serial arm resonator S2 on a side closer to the parallel arm resonator P1. Furthermore, the structure of the parallel arm resonator P1 is not limited to the case in which the metal film 65 is not provided over the entire or substantially the entire region opposite to the wiring portion 50, and the metal film 65 may be provided in a portion of the region opposite to the wiring portion 50.

In a portion (region RG2) of the serial arm resonator S2 in which the support layer 30 is provided, because the wiring portion 50 and the metal film 65 are opposite to each other with the interposition of the support layer 30 made of an insulating material therebetween, a capacitor is provided in the above-described portion. In such a case, a path extending from the IDT electrode on an input side of the serial arm resonator S2 to the IDT electrode on an output side through the metal film 65 is provided (as denoted by an arrow AR1 in FIG. 17). This provides a structure in which a capacitor is connected to the IDT electrode 40 of the serial arm resonator S2 in parallel.

On the other hand, in the parallel arm resonator P1, because the wiring portion 50 is not provided in a portion (region RG3) opposite to the metal film 65, no coupling occurs between the wiring portion 50 and the metal film 65 unlike the serial arm resonator S2. Accordingly, a capacitor connected to the IDT electrode 40 of the parallel arm resonator P1 in parallel is not provided.

As described above, in the acoustic wave device in the ladder filter in which the metal film is used as the high impedance layer in the intermediate layer, the influence on the filter characteristics can be reduced by providing the structure in which the wiring portion connected to the parallel arm resonator and the metal film do not overlap with each other in the plan view of the acoustic wave device.

Preferred Embodiment 8

In the ladder filter, as described in Preferred Embodiment 7, the sharpness of the attenuation characteristics on the higher frequency side in the band width of the band pass filter can be increased by connecting a capacitor to the serial arm resonator in parallel and thus reducing the band width ratio of the serial arm resonator.

Preferred Embodiment 8 of the present invention is described with respect to the arrangement of a capacitor (bridging capacitance) that is connected to the serial arm resonator in parallel in order to increase the sharpness of the attenuation characteristics in the ladder filter.

Figure 18:
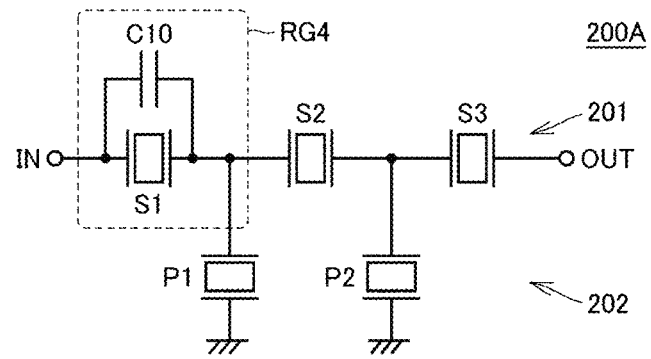
FIG. 18 is a circuit diagram illustrating an example of a ladder filter according to Preferred Embodiment 8 of the present invention.
Figure 19:
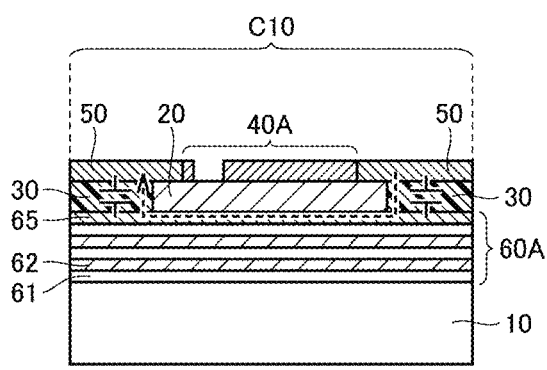
FIG. 19 is a sectional view of a bridging capacitance portion in FIG. 18.

FIG. 18 is a circuit diagram illustrating an example of a ladder filter 200A according to Preferred Embodiment 8. The filter 200A is configured by adding, to the structure of the filter 200 of Preferred Embodiment 7, a bridging capacitance portion C10 that is connected to the serial arm resonator S1 in parallel. The bridging capacitance portion C10 in the filter 200A has a similar structure to that of each of the resonators (resonant sections) included in the serial arm circuit 201 and the parallel arm circuit 202. More specifically, as illustrated in the sectional view of FIG. 19, the bridging capacitance portion C10 has a structure in which an IDT electrode 40A is provided on the piezoelectric thin film 20 laminated on an intermediate layer 60A.

Figure 20:
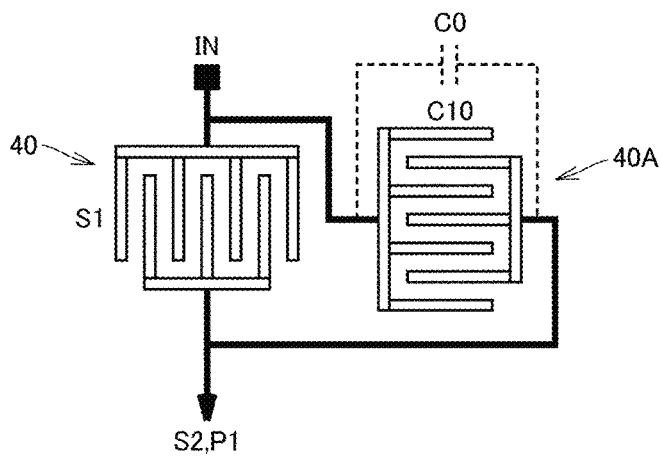
FIG. 20 is a schematic plan view of a portion denoted by a region RG4 illustrated in FIG. 18.

As illustrated in a schematic plan view (FIG. 20) of a region RG4 in FIG. 18, however, electrode fingers of the IDT electrode 40A in the bridging capacitance portion C10 are parallel or substantially parallel to the propagation direction of the surface acoustic wave. Therefore, the IDT electrode 40A is not excited by the surface acoustic wave and defines and functions as a capacitor.

In the filter 200A, the metal film 65 is disposed opposite to the piezoelectric thin film 20 and the support layer 30 to define and function as the uppermost high impedance layer 62 in the intermediate layer 60A of the bridging capacitance portion C10. This provides a structure in which a capacitor C0 is connected in parallel to the IDT electrode 40A to define the bridging capacitance portion C10, as indicated by dotted lines in FIG. 20.

Because a capacitance increases with a capacitor connected in parallel, the capacitance of the bridging capacitance portion C10 can be reduced by utilizing the capacitor C0 that is defined by the metal film 65 in the intermediate layer 60A. The capacitance of the bridging capacitance portion C10 is determined depending on the size of the IDT electrode 40A. As a result, the size of the bridging capacitance portion C10 can be reduced.

Although FIG. 18 has been described with respect to the example in which the bridging capacitance portion is disposed in association with the serial arm resonator S1, the bridging capacitance portion may be disposed in association with the serial arm resonator S2 and/or the serial arm resonator S3, instead of or in addition to the structure illustrated in FIG. 18.

Preferred Embodiment 9

As described in Preferred Embodiment 7 and Preferred Embodiment 8, in the ladder filter having the structure in which the metal film is disposed as the high impedance layer in the intermediate layer, a capacitor connected to a resonator in parallel can be provided by arranging the wiring portion and the metal film opposite to each other.

Furthermore, as described above, the band width ratio of a serial arm resonator can be adjusted by providing a capacitor connected to the serial arm resonator in parallel. In consideration of that point, Preferred Embodiment 9 of the present invention is described in connection with a structure in which the capacitance of a capacitor connected to each serial arm resonator in parallel can be adjusted by changing, for each serial arm resonator, an area where the wiring portion and the metal film overlap with each other.

Figure 21:
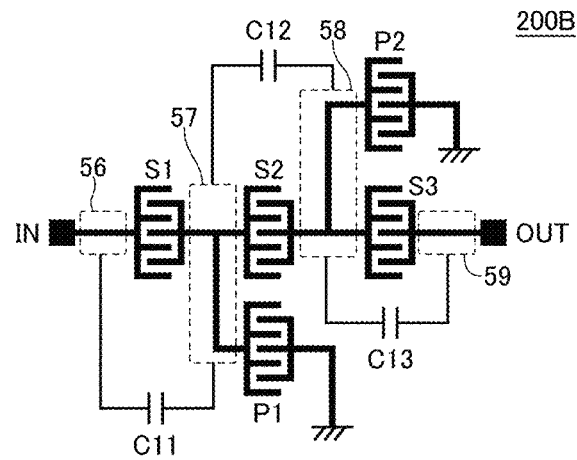
FIG. 21 is a schematic plan view of a ladder filter according to Preferred Embodiment 9 of the present invention.

FIG. 21 is a schematic plan view of a ladder filter 200B according to Preferred Embodiment 9. The filter 200B has a circuit the same as or similar to that illustrated in the circuit diagram of FIG. 15 showing Preferred Embodiment 7, and it includes the serial arm resonators S1 to S3 and the parallel arm resonators P1 and P2.

Figure 22:
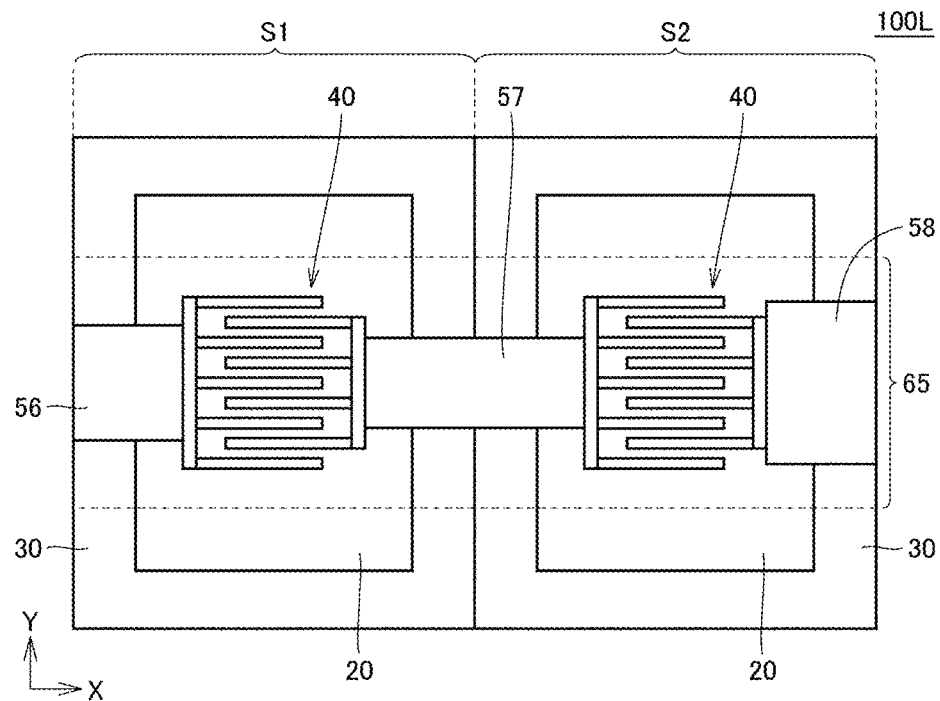
FIG. 22 is a plan view of a portion of the ladder filter illustrated in FIG. 21 including serial arm resonators S1 and S2.

FIG. 22 is a plan view of an acoustic wave device 100L corresponding to the filter 200B, the portion including the serial arm resonator S1 and the serial arm resonator S2.

In the filter 200B, the metal films 65 are provided as the high impedance layers in the intermediate layers opposite to the wiring portions on the input side and the output side of each serial arm resonator (FIG. 22). Accordingly, in the serial arm resonator S1, a capacitor C11 is provided between a wiring portion 56 on the input side and a wiring portion 57 on the output side. In the serial arm resonator S2, a capacitor C12 is provided between the wiring portion 57 on the input side and a wiring portion 58 on the output side. In the serial arm resonator S3, a capacitor C13 is provided between the wiring portion 58 on the input side and a wiring portion 59 on the output side.

The capacitance of the capacitor provided by each wiring portion and the metal film 65 can be adjusted by changing the area where each of the wiring portions on the input side and the output side to define the capacitor and the metal film overlap with each other. In other words, as illustrated in FIG. 22, the capacitance of the capacitor can be changed by adjusting a line width of each wiring portion. Instead, widths of the metal films 65 provided opposite to the wiring portions may be individually changed while the line width of the wiring portions is maintained fixed. Here, the wiring portion on the input side refers to a wiring portion that is connected to a busbar on the input side of the IDT electrode in each resonator, and the wiring portion on the output side refers to a wiring portion that is connected to a busbar on the output side of the IDT electrode in each resonator.

As described above, since the band width ratio can be adjusted for each serial arm resonator by changing an amount of overlap between the wiring portion and the metal film and thus adjusting the capacitance of the capacitor connected to each serial arm resonator in parallel, a degree of freedom in design of the ladder filter can be increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate; and
   a first resonant section and a second resonant section that are adjacent to each other on the support substrate; wherein
   each of the first resonant section and the second resonant section includes:
      a piezoelectric thin film;
      an interdigital transducer electrode on the piezoelectric thin film; and
      a support layer surrounding the piezoelectric thin film in a plan view of the acoustic wave device, and having a different linear expansion coefficient from the piezoelectric thin film;
   the piezoelectric thin film in the first resonant section and the piezoelectric thin film in the second resonant section are divided by the support layer between the first resonant section and the second resonant section; and
   a projection projecting in a first direction toward the support substrate from the first resonant section and the second resonant section is provided in an edge portion of a surface of the support layer, the surface being located on a side closer to the support substrate.

2. The acoustic wave device according to claim 1, further comprising an intermediate layer between at least one of the first resonant section and the second resonant section and the support substrate.

3. The acoustic wave device according to claim 2, wherein a portion of the intermediate layer between the piezoelectric thin film and the support substrate in the first resonant section and a portion of the intermediate layer between the piezoelectric thin film and the support substrate in the second resonant section are divided by the support layer between the first resonant section and the second resonant section.

4. The acoustic wave device according to claim 2, wherein the intermediate layer includes a high acoustic velocity layer through which an acoustic bulk wave propagates at a higher velocity than an acoustic wave propagating through the piezoelectric thin film.

5. The acoustic wave device according to claim 2, wherein the intermediate layer includes a multilayer body including a first layer with a first acoustic impedance and a second layer with a second acoustic impedance higher than the first acoustic impedance that are alternately laminated.

6. The acoustic wave device according to claim 5, further comprising a protective layer provided in a boundary region between the second layer and the support layer in the intermediate layer.

7. The acoustic wave device according to claim 6, wherein the protective layer is provided by oxidizing or nitriding the second layer.

8. The acoustic wave device according to claim 2, wherein the projection is provided in the intermediate layer.

9. The acoustic wave device according to claim 2, wherein the support substrate is a silicon substrate;
the support layer is made of polyimide;
a layer in the intermediate layer in contact with the support substrate is made of silicon dioxide;
a charge generation layer is provided at an interface between the support substrate and the intermediate layer; and
a lower surface of the support layer is located on a side away from the interface between the support substrate and the intermediate layer in a first direction toward the support substrate from the first resonant section and the second resonant section.

10. The acoustic wave device according to claim 2, further comprising a protective layer between the intermediate layer and the support layer.

11. The acoustic wave device according to claim 2, further comprising a protective layer covering the piezoelectric thin film and the support layer.

12. The acoustic wave device according to claim 2, wherein
the acoustic wave device is a ladder filter including a serial arm circuit including the first resonant section and a parallel arm circuit including the second resonant section;
a metal film is provided in at least a portion of the intermediate layer;
the acoustic wave device further includes a wiring portion provided on the support layer and connected to the second resonant section; and
at least a portion of the wiring portion and the metal film do not overlap with each other in the plan view of the acoustic wave device.

13. The acoustic wave device according to claim 2, wherein
the acoustic wave device is a ladder filter including a serial arm circuit including the first resonant section and a parallel arm circuit including the second resonant section;
the acoustic wave device further includes a bridging capacitance portion connected to the first resonant section in parallel;
the bridging capacitance portion includes a piezoelectric thin film and an IDT electrode disposed on the piezoelectric thin film;
the intermediate layer is further provided between the bridging capacitance portion and the support substrate;
a metal film is provided in at least a portion of the intermediate layer; and
the bridging capacitance portion and the metal film overlap with each other in the plan view of the acoustic wave device.

14. The acoustic wave device according to claim 2, wherein
the acoustic wave device is a ladder filter including a serial arm circuit and a parallel arm circuit;
the serial arm circuit includes the first resonant section and the second resonant section;
a metal film is provided in at least a portion of the intermediate layer;
the acoustic wave device further includes first to fourth wiring portions provided on the support layer;
the first wiring portion is connected to a busbar on an input side of the IDT electrode in the first resonant section;
the second wiring portion is connected to a busbar on an output side of the IDT electrode in the first resonant section;
the third wiring portion is connected to a busbar on an input side of the IDT electrode in the second resonant section;
the fourth wiring portion is connected to a busbar on an output side of the IDT electrode in the second resonant section; and
in the plan view of the acoustic wave device, an area where the first wiring portion and the second wiring portion overlap with the metal film is different from an area where the third wiring portion and the fourth wiring portion overlap with the metal film.

15. The acoustic wave device according to claim 1, wherein the projection is provided in the support substrate.

16. The acoustic wave device according to claim 1, wherein a portion of the support layer is located on a surface of each of the piezoelectric thin films in the first resonant section and the second resonant section.

17. The acoustic wave device according to claim 1, wherein a thickness of a portion of the support layer other than an outer peripheral portion of the acoustic wave device is thicker than a thickness of the support layer in the outer peripheral portion of the acoustic wave device.

* * * * *